United States Patent [19]

Bargman

[11] 4,421,586

[45] Dec. 20, 1983

[54] PROCESS, DISPOSABLE ROLLER COVER, AND MASKING PREFORM FOR REMOVING ADHESIVE TAPE

[76] Inventor: Ronald Bargman, 1517 Ferris, Royal Oak, Mich. 48067

[21] Appl. No.: 419,907

[22] Filed: Sep. 20, 1982

[51] Int. Cl.³ ............................................. B32B 31/00
[52] U.S. Cl. ................................... 156/247; 156/248; 156/250; 156/289; 156/344; 156/510; 156/584; 204/15; 427/282
[58] Field of Search ............... 156/247, 248, 344, 510, 156/584, 250, 289; 427/282; 204/15, 17, 18, 181 R

[56] References Cited

U.S. PATENT DOCUMENTS 3,888,745 6/1975 Hojyo .................................. 156/344
3,957,568 5/1976 Abel .................................... 156/510

*Primary Examiner*—Edward C. Kimlin
*Assistant Examiner*—Timothy W. Heitbrink

*Attorney, Agent, or Firm*—John R. Benefiel

[57] ABSTRACT

A process, disposable roller cover, and masking preform is disclosed for removing adhesive tape such as is used in masking PC boards during contact electroplating. The adhesive masking tape is wrapped about one end of the PC board over a masking preform consisting of a clip friction fit to the one side of the board. The wrapped tape and preform are initially severed, and rollers having covers carrying an adhesive band are brought into pressure contact with the severed ends. The PC board is moved past the rollers to pick up the lengths of adhesive tape and strip them from the PC board by winding on the roller covers. The severed ends of the lengths of tape are rendered strippable to facilitate removal by the presence of the masking preform, which is also removed during stripping by adhesion to the masking tape. The disposable roller covers carrying an adhesive band are removed and replaced after a predetermined maximum accumulation of tape winding.

5 Claims, 6 Drawing Figures

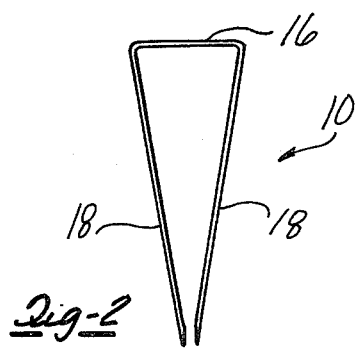
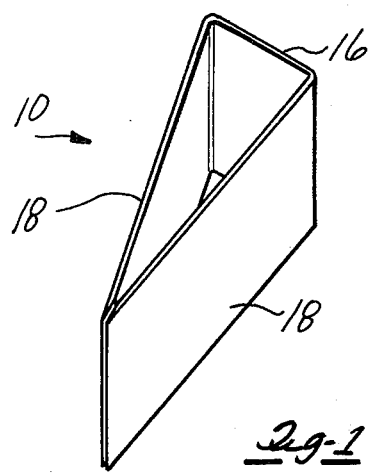
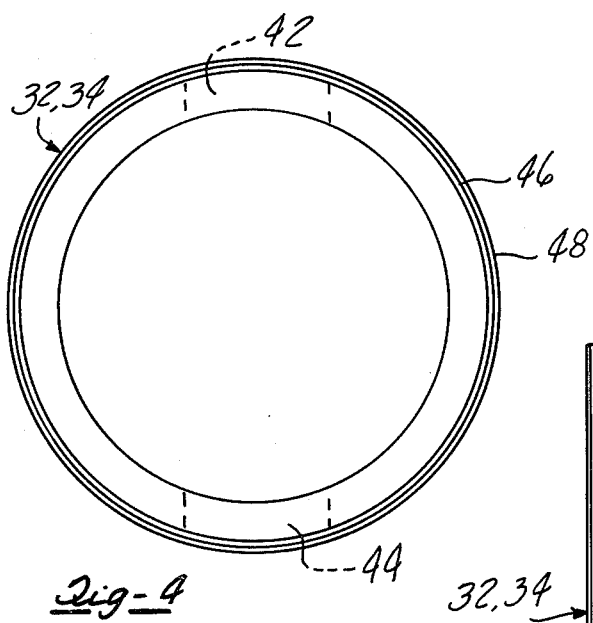
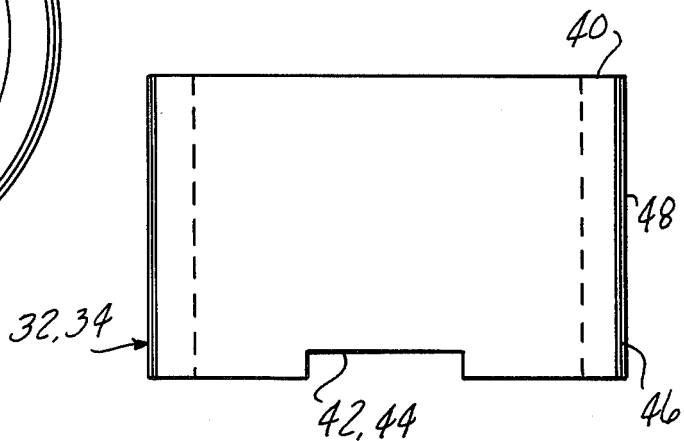
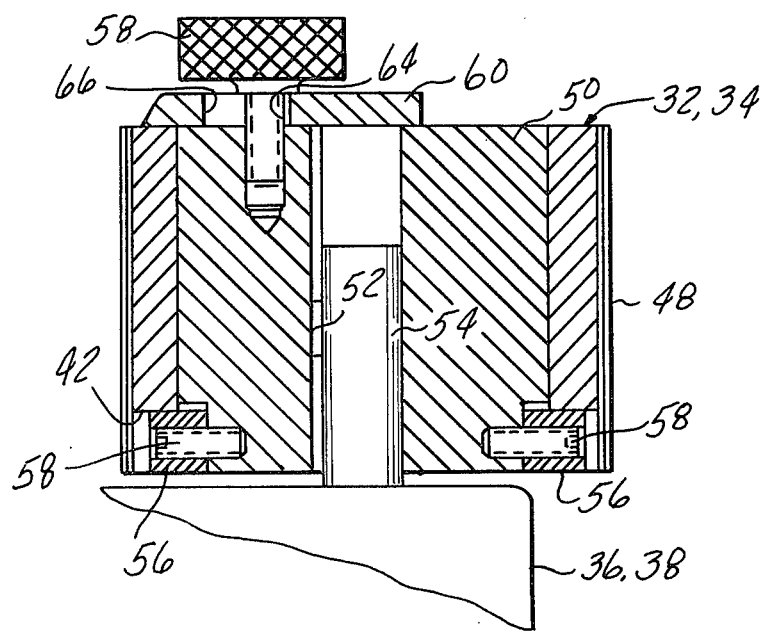

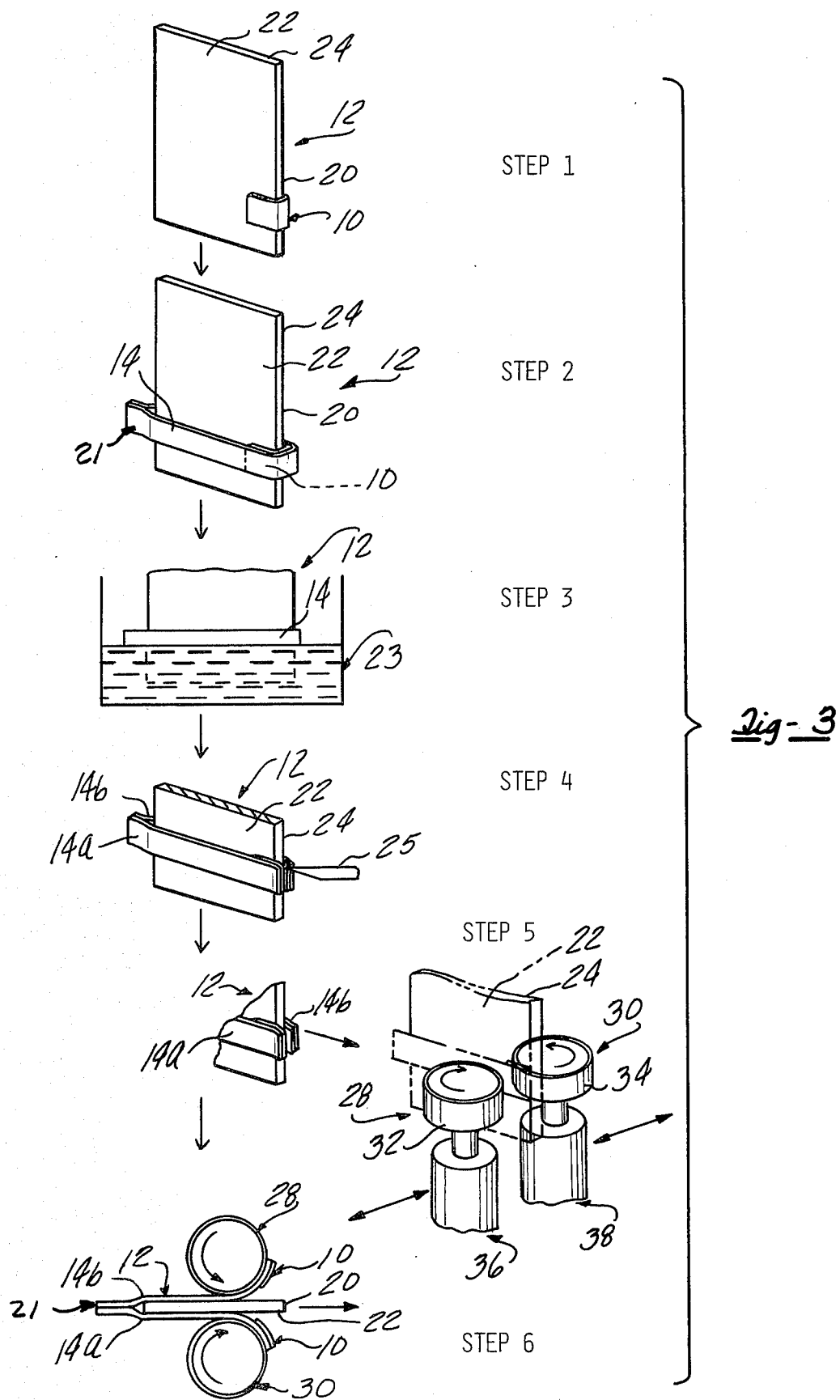

PROCESS, DISPOSABLE ROLLER COVER, AND MASKING PREFORM FOR REMOVING ADHESIVE TAPE

BACKGROUND OF THE INVENTION

This invention concerns the application and removal of pressure adhesive sheet layers, such as masking tape used in the manufacture of printed circuit boards. The manufacture of PC boards currently involves the plating of contacts along one or both sides of the PC board. The contacts are most commonly plated with gold by an electrodeposition process, involving immersion of the side of the PC board in a gold salt bath. The extremely high cost of gold metal as well as a need for a clear border between gold fingers and the rest of the board has led to the use of lengths of masking tape applied to the side surfaces of the board to accurately limit the region immersed in the plating solution. The pressure adhesive masking tape is applied manually or by machine, and is manually removed after the plating process is complete. The tape must be tightly adherent in order to effectively mask the area of the PC board sought to be isolated from the plating solution, and thus the tape removal process has created a labor intensive step in the process of manufacture of circuit boards as it is now practiced.

Prior attempts have been made to mechanize or automate this process by mechanical stripping of the tape, essentially by vise gripping of the "tail" section and movement of the board by conveyor rollers. Such approach has not been able to be implemented with an acceptable level of reliability.

In copending application Ser. No. 351,989, filed Feb. 24, 1982, there is disclosed a process and apparatus for automatically accomplishing the stripping of such masking tape, which involves the use of rollers which adhere to the outside of the tape and enable winding up of the stripped tape. In order to facilitate the stripping, an area of localized low adhesion is established at the lead end of the PC board. This is disclosed as being achieved by a release agent, or a special configuration of masking tape.

It is an object of the present invention to provide a process and preform which enables practice of that process with a highly reliable and effective establishment of non-adhesive areas beneath the masking tape.

It is another object of the present invention to provide a disposable roller cover for use in the removal process.

SUMMARY OF THE INVENTION

These and other objects of the present invention are achieved by a process and a preform which is comprised of a clip of thin gauge plastic, or other easily severed material which is shaped with inwardly folded sides, enabling a secure friction retention on the leading edge of the board by spring force created upon installation. The masking tape is then wrapped over the preform and about the remainder of the PC board in conventional fashion with the tape free ends joined on the side of the PC board opposite to the mask preform. After the plating operation is complete, the tape is removed by initially severing the tape and mask preform on the wrapped side.

The severed ends of each length of tape are therefore able to be freely lifted from the surface of the PC board.

In the preferred form of the invention, opposed rollers each having an adhesive band on their periphery are employed to remove the tape. In this case, the severed ends are each adhered to a roller adhesive band on the PC board as it is passed between and in contact with the rollers, with continued lift off of each of the lengths of tape for the remainder of their length assured by the adhesion of the ends to a respective roller periphery.

The adhesive band on the rollers initially may be provided by a removable disposable roller cover or ring, constructed of a lightweight material such as paperboard having a layer of double-backed adhesive tape applied thereto, which ring is removed and replaced upon an increase in the diameter of the roller with successive windings of the removed tape to a predetermined maximum diameter.

BRIEF DESCRIPTION OF THE DRAWINGS

FIG. 1 is a perspective view of a masking preform according to the present invention.

FIG. 2 is an end view of the masking preform shown in FIG. 1.

FIG. 3 is a diagrammatic flow chart illustrating the successive steps in the application and removal of tape according to the process of the present invention.

FIG. 4 is an endwise view of a disposable roller cover carried over each of the rollers utilized in the process according to the present invention.

FIG. 5 is an endwise view of the roller cover shown in FIG. 4.

FIG. 6 is a sectional view of the roller assembly according to an alternate embodiment.

DETAILED DESCRIPTION

In the following detailed description, certain specific terminology will be employed for the sake of clarity and a particular embodiment described in accordance with the requirements of 35USC112. It should be understood that this is not intended to be limiting and indeed should not be so construed inasmuch as the invention is capable of taking many forms and variations within the scope of the appended claims.

In particular, the process masking preform and roller covers as will be described herein are specifically directed to the removal of masking tape from printed circuit boards in which a length of tape is passed about one edge of the circuit board and extending along the opposite side surfaces thereof, with projecting short lengths or tails at the joined ends. This for the purpose of masking certain areas of the PC board during electrodeposition plating of contact areas along the lower edge. However, other applications of the process on generally planer bodies are possible.

The process and apparatus does, however, have a particularly advantageous application to the process of plating the contacts on PC boards.

As a part of the process according to the present invention, a masking preform 10 shown in FIGS. 1 and 2 is employed. The preform 10 is intended to be installed on one side of a PC board 12 (shown in FIG. 3) to thereby achieve localized areas of low adhesion of the masking tape 14 applied prior to plating operations.

The masking preform 10 here takes the form of a clip constructed of thin, colored polyester film, i.e., of a thickness on the order of 0.003 inches, such as to be sufficiently rigid to be capable of being formed into the shape shown in FIGS. 1 and 2. The clip includes a front wall 16 and a pair of sides 18 formed to be converging towards the center of the front wall 16. The depth of the clip is selected to be substantially the same as that of the masking tape to be used to cover the PC board.

Referring to FIG. 3, the process as applied to the manufacture of a PC board 12 is illustrated in a simplified diagrammatic form. In step 1, the preform 10 is installed by being friction fit over one edge of the PC board 12. This creates localized areas constituted by the preform sides 18 located on either side 20 and 22 of the PC board 12 which are to be taped.

In step 2, a length of adhesive masking tape 14 is then wrapped about the leading edge 20, defined as that edge on which the preform 10 is installed.

The length of adhesive tape 14 is applied to extend along both sides 22 and 24 of the PC board 12. The free ends of the tape length 14 are adhesively secured to each other to produce a tail portion 21 extending from the trailing edge of the PC board 12.

In step 3, the plating operation is conducted by immersion of the PC board 12 in a salt solution bath, diagrammatically indicated at 23. This step, of course, does not form a part of the present invention and accordingly, a detailed description is not here included of the particulars of this process.

After completion of the plating process, the tape 14 and preform 10 adjacent or overlying the leading edge 20 of the PC board 12 are slit (either manually or by automatic equipment) as indicated in step 4 of FIG. 3. This may be by a knife point 25 moved along the leading edge surface 24, or along the side surface immediately adjacent thereto. The now free severed ends of the resulting two lengths of tape overlie the severed preform sides 18 which are thus released to be easily strippable.

In step 5, the PC board 12 is appropriately positioned to be passed into pressure contact with a pair of rollers 28 and 30, each mounted for rotation about an axis parallel to the surfaces or sides 22 and 24 of the PC board 12 which carries the lengths of adhesive tape 14a and 14b. Each of the rollers 28 and 30 carries a roller cover 32 and 34 each having a band of adhesive which comes into pressure contact with a respective one of the lengths of adhesive tape 14a and 14b. The roller covers 32 and 34 are thereby adhered to the adhesive tape to be removed by pressure contact, and due to the non-adhesion of the tape lengths overlying the sides 18 of the masking preform, these are easily lifted off by adhesion to the covers 32 and 34 and rotation of the rollers 28 and 30, and the relative movement of the PC board 12 past and between the rollers 28 and 30.

As the PC board 12 is so moved, the lengths of tape 14a and 14b are wound onto the periphery of the roller covers 28 and 30 respectively so as to be removed from the PC board 10. Each of the rollers 28 and 30 may be powered by motors 36 and 38 so that the advancement of the PC board 12 through the rollers 28 and 30 is achieved by engagement with the opposite sides 22 and 24 of the PC board 12, as indicated in step 6 in FIG. 3.

The rollers 28 and 30 are initially separated and upon approach of the PC board 12, the roller motor assemblies are moved toward each other so as to engage the respective tape lengths as the PC board 12 moves into the space therebetween.

Suitable apparatus for carrying out this process is described in U.S. Ser. No. 351,989, filed on Feb. 24, 1982.

In FIGS. 4–6, the details of the roller covers 32 and 34 and the installation thereof are shown. Each cover 32 and 34 is comprised of a ring 40 constructed of paperboard or other low cost material and having recesses 42 and 44 diametrically opposite each other and which extend axially from one side thereof. A length of double faced tape 46 is applied about the periphery to establish an outer adhesive surface. A protective film 48 may also be applied to cover and protect the adhesive until installation.

Referring to FIG. 6, each cover 32 and 34 is installed on a hub 50 keyed at 52 to motor shaft 54. The hub 50 has a pair of segments 56 affixed thereto at diametrically opposite locations by means of set screws 58. Each segment is configured and located to be interfit with a recess 42 or 44.

A retainer bar 60 is secured to the hub 50 by a thumb screw 62 received in a threaded opening 64 extending axially into the end face of the hub 50. The retainer bar 60 is provided with an elongated slot 66 which allows adjustment of its radial position to enable convenient removal of the paperboard ring 40.

Upon build-up of the diameters of the rollers with the successive windings of the removed lengths of tape, the covers 32 or 34 and accumulated windings may be removed and replaced with a replacement roller cover.

Accordingly, it may be appreciated that the above recited objects of the present invention have been achieved by the process masking preform and roller covers described.

Alternative arrangements of the specific structure shown are possible, such as the use of a simple pin drive of the roller covers on the hubs, and bayonet connections with the roller covers to retain them on the hubs.

I claim:

1. A process for applying and removing pressure sensitive tape from opposite side surfaces of a generally planer body having edge surfaces comprising the steps of:
installing a masking preform on one edge of said body, said preform being frictionally secured by a pair of sides deflected upon installation to generate a spring force urging said sides into frictional engagement with a respective side surface, said sides overlying localized areas adjacent either side of said one edge;
applying a length of pressure sensitive tape to said planer body by wrapping about said edge and over said masking preform and extending along said side surfaces;
severing said masking preform and said tape along said edge; and
stripping said severed lengths by lifting off said severed ends overlying said severed portions of said preform and pulling said tape lengths free from said side surfaces.

2. The process according to claim 1 wherein said stripping step includes the steps of passing said body between a pair of opposing rollers, each carrying an adhesive band about the periphery thereof with said portions of tape in registry with said adhesive bands while urging said rollers into pressure contact therewith.

3. The process according to claim 2 wherein said rollers are rotated while in engagement with said surfaces to cause said body to pass between said rollers.

4. The process according to claim 1 wherein said masking preform is constructed of a thin polyester film formed into a clip to form said sides.

5. A process for applying and removing pressure adhesive masking tape from printed circuit boards from a leading edge and sides adjacent thereof, the process including the steps of:

forming a clip adapted to be friction fit about said leading edge and having sides overlying printed circuit board side surfaces;

applying a length of said tape about said leading edge and over said clip and along said sides;

severing said tape and said clip at said leading edge;

introducing said leading edge of said board between a pair of opposed rollers each carrying a band of adhesive and passing said board therebetween while urging said adhesive bands into pressure contact with said severed tape lengths, whereby said tape lengths and severed clip are removed by adherence to said adhesive bands and winding up on said rollers.

* * * * *